(12) United States Patent
Shia et al.

(10) Patent No.: US 10,595,439 B2
(45) Date of Patent: Mar. 17, 2020

(54) MOVABLE HEATSINK UTILIZING FLEXIBLE HEAT PIPES

(71) Applicant: Intel Corporation, Santa Clara, CA (US)

(72) Inventors: David Shia, Portland, OR (US); Evan Chenelly, Portland, OR (US); Mohanraj Prabhugoud, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/017,731

(22) Filed: Jun. 25, 2018

(65) Prior Publication Data

US 2019/0045663 A1 Feb. 7, 2019

(51) Int. Cl.
*H05K 7/20* (2006.01)
*F28D 15/02* (2006.01)
(Continued)

(52) U.S. Cl.
CPC ..... *H05K 7/20409* (2013.01); *F28D 15/0233* (2013.01); *F28D 15/0241* (2013.01);
(Continued)

(58) Field of Classification Search
None
See application file for complete search history.

(56) References Cited

U.S. PATENT DOCUMENTS

| 9,348,377 B2 * | 5/2016 | Dean ..................... G06F 1/20 |
| 2007/0211426 A1 * | 9/2007 | Clayton ............... H01L 23/473 |
| | | 361/689 |

(Continued)

FOREIGN PATENT DOCUMENTS

| CN | 201138148 Y | 10/2008 |
| CN | 201522215 U | 7/2010 |

(Continued)

OTHER PUBLICATIONS

Tanmay Jaipurkar et al., "Thermo-mechanical design and characterization of flexible heat pipes", Oct. 27, 2016, 10 pages, http://www.elsevier.com/locate/apthermeng.

(Continued)

*Primary Examiner* — Courtney L Smith
(74) *Attorney, Agent, or Firm* — Schwabe, Williamson & Wyatt, P.C.

(57) ABSTRACT

Embodiments described herein may include apparatuses, systems and/or processes to provide a cooling apparatus that includes a first heatsink, a second movable heatsink and a flexible thermal conductor physically and thermally coupled with the first and second heatsinks, where the flexible thermal conductor is to flex and remain thermally coupled with the first heatsink and the second heatsink, when the second heatsink is moved relative to the first heatsink. The first heatsink may be coupled to a heat source such as a processor that may be coupled with a PCB. Also, the movable heatsink may allow access to components, such as dual in-line memory modules (DIMMs) that are next to the first heatsink and under the movable second heatsink. Other embodiments may be described and/or claimed.

19 Claims, 4 Drawing Sheets

(51) Int. Cl.
*H05K 1/18* (2006.01)
*H05K 1/02* (2006.01)
*G06F 1/20* (2006.01)
*H01L 23/427* (2006.01)
*F28F 1/30* (2006.01)
*H01L 23/467* (2006.01)
*H01L 23/367* (2006.01)

(52) U.S. Cl.
CPC ............ *F28D 15/0275* (2013.01); *F28F 1/30* (2013.01); *G06F 1/20* (2013.01); *H01L 23/427* (2013.01); *H05K 1/0203* (2013.01); *H05K 1/181* (2013.01); *H05K 7/20809* (2013.01); *H01L 23/3672* (2013.01); *H01L 23/467* (2013.01); *H05K 2201/10159* (2013.01)

(56) References Cited

U.S. PATENT DOCUMENTS

| | | | | |
|---|---|---|---|---|
| 2007/0258217 A1* | 11/2007 | Roper | ............ | H01L 23/367 361/709 |
| 2008/0003712 A1* | 1/2008 | Moden | ............ | H01L 25/105 438/106 |
| 2008/0066891 A1 | 3/2008 | Jeng | | |
| 2008/0092973 A1 | 4/2008 | Lai | | |
| 2011/0220328 A1 | 9/2011 | Huang et al. | | |
| 2011/0286179 A1* | 11/2011 | Motschman | ............ | G06F 1/20 361/679.54 |
| 2013/0168058 A1* | 7/2013 | Chamseddine | ......... | G06F 1/203 165/104.26 |
| 2013/0208422 A1* | 8/2013 | Hughes | ............ | H05K 7/20445 361/700 |
| 2015/0043160 A1 | 2/2015 | Tunks et al. | | |
| 2015/0261266 A1* | 9/2015 | Dean | ............ | G06F 1/20 361/679.46 |
| 2016/0263714 A1* | 9/2016 | Yang | ............ | H01L 23/427 |
| 2017/0234623 A1* | 8/2017 | Fried | ............ | F28D 15/0266 165/104.26 |
| 2018/0031329 A1* | 2/2018 | Wang | ............ | F28D 15/0241 |
| 2018/0196763 A1* | 7/2018 | Fahmy | ............ | G06F 13/1668 |

FOREIGN PATENT DOCUMENTS

CN 102169857 A 8/2011
EP 2759794 B1 10/2017

OTHER PUBLICATIONS

CRS Engineering "Heat-pipes & Systems" 2 pages, retrieved on Jun. 25, 2018, http://www.heat-pipes.com/index.php?sectionid=6.

* cited by examiner

MOVABLE HEATSINK UTILIZING FLEXIBLE HEAT PIPES

BACKGROUND

As components of computing or electronic systems decrease in size and increase in power requirements as well as thermal dissipation, cooling individual components as well as collections of components will become increasingly important to ensure proper system function moving forward. For example central processing unit (CPU) dies are miniaturizing and at the same time the number of cores, heat dissipation, and thermal design power (TDP) of these dies are increasing. This can result in a higher heat flux from the CPU dies and increase the challenge for thermally managing the CPU.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
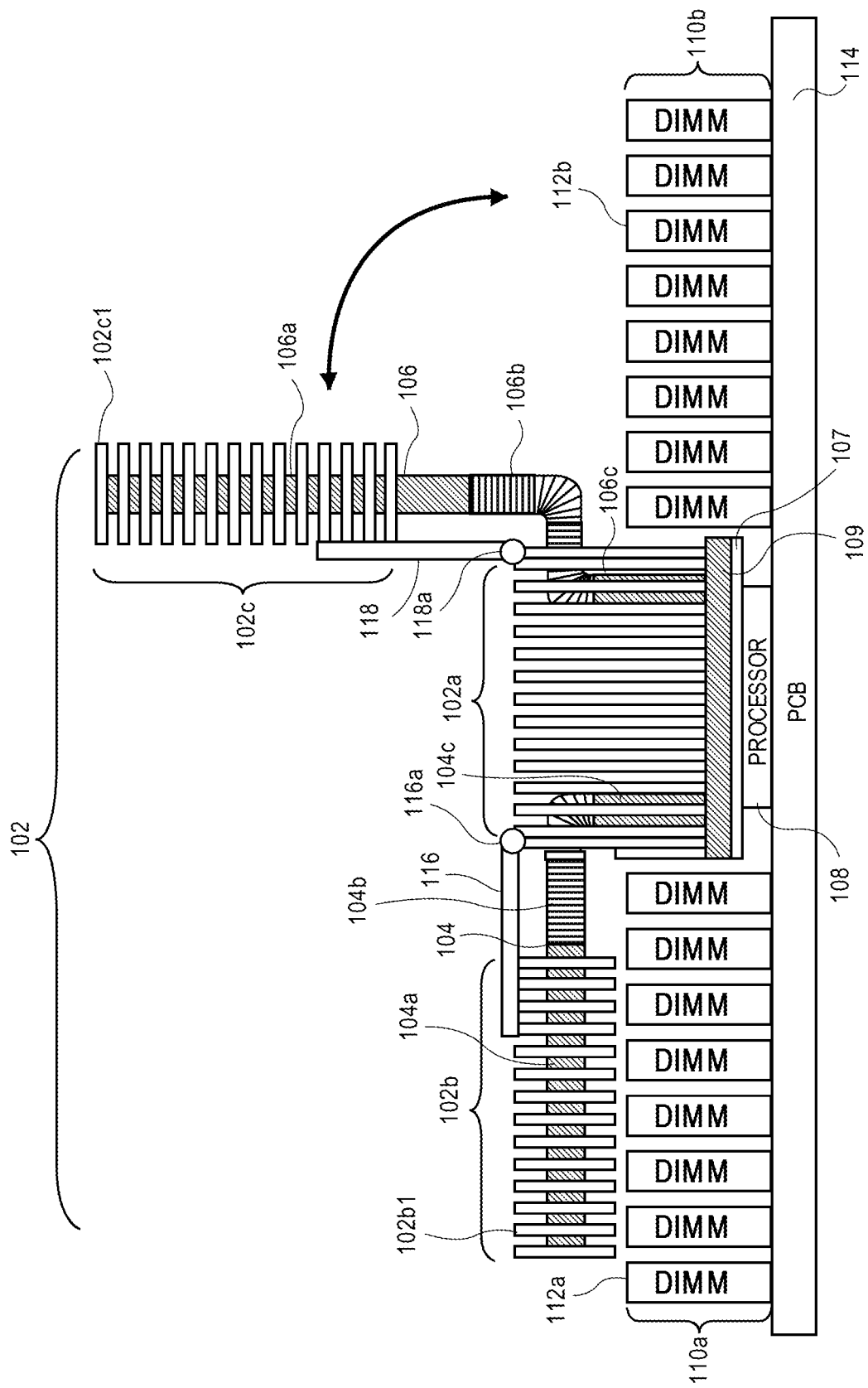
FIG. 1 shows an example of movable heatsinks coupled to a fixed heatsink on a printed circuit board (PCB), in accordance with various embodiments.

Embodiments described herein may include apparatuses, systems and/or processes to provide a cooling apparatus that may include a first heatsink, a second movable heatsink and a flexible thermal conductor physically and thermally coupled with the first and second heatsinks, where the flexible thermal conductor may flex and remain thermally coupled with the first heatsink and the second heatsink, when the second heatsink may be moved relative to the first heatsink. The first heatsink may be coupled to a heat source such as a processor that may be coupled with a PCB. Also, the movable heatsink may allow access to components, such as dual in-line memory modules (DIMMs) that may be disposed next to the first heatsink and under the movable second heatsink.

Legacy enterprise server heatsink design may have a narrow keep-out zone, even as processors continue to increase in power. One way to increase the performance of a processor, in particular high thermal design power (TDP) processors, is to increase the surface area and airflow volumes available to the heatsink servicing the processor. Increasing the volume of the heatsink may both increase the surface area and the total airflow of the heatsink, which may significantly increase the power capability of the heatsink.

For example, in a 2U server configuration, there may be space available above the DIMMS mounted on a PCB for cooling the processor mounted nearby. This space may be close enough to be utilized by a heat pipe heatsink, particularly a heatsink that may overlap above the DIMMs. For example, a fixed "T-Shape" heatsink may be used. However, legacy installation of a fixed heatsink onto a processor into this area may make it difficult to service DIMMs, or any other component that may be obscured by the overlapping heatsink. The heatsink may need to be removed in order to readily access DIMMs or other components proximate to the processor for insertion or removal. Removing this type of heatsink may be costly because it may require physical removal of the heatsink from the processor and reapplication of the heatsink to the processor after DIMM servicing is complete. This approach may complicate and lengthen the time needed for servicing the DIMMs. It may require new thermal interface material (TIM) to be re-applied, may create wear on the socket, and may result in bent pins on the processor.

In embodiments, a flexible heat pipe that connects a fixed heatsink and a movable heatsink may be used to allow a user to move movable portions of the heatsink out of the way to access DIMMs or other components that may be proximate to the processor and under the movable portions of the heatsink. After servicing the DIMMs or other components, the movable heatsink may be moved or folded back into place. In this way, DIMMs or other components may be serviced without unseating the processor or detaching the fixed portion of the heatsink to the processor.

Cloud or scientific computing may require high performance servers with high performance CPU that may generate significant amount of heat. And the servers may have a high density of components. The embodiments described herein may provide a high thermal removal requirement and the accessibility of dense number of components, making high value high performance servers possible.

In the following description, various aspects of the illustrative implementations are described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "including," "having," and the like, as used with respect to embodiments of the present disclosure, are synonymous.

FIG. 1 shows an example of movable heatsinks coupled to a fixed heatsink on a printed circuit board (PCB), in accordance with various embodiments. Diagram 100 shows an example heatsink 102 that may include flexible heat pipes 104, 106. Heatsink 102 may include a fixed heatsink 102a that is thermally and/or physically coupled to a heat source 108, such as a processor that may be attached to a PCB 114. The heat source 108 may be coupled to the fixed heatsink 102a using a TIM layer 107. In embodiments, the fixed heatsink 102a may include a heat spreader 109.

The heatsink 102 may include a first movable heatsink 102b, which may be shown in a first position that may be proximate to one or more DIMMs 112a that may be attached to the PCB 114. The DIMMs 112a may be disposed in the space 110a between the first movable heatsink 102b and the PCB 114. The DIMMs 112a, 112b may be shown for purposes of illustration. Other computer components may be disposed under the movable heatsinks 102b, 102c as needed. The first movable heatsink 102b may be thermally and/or physically coupled to the fixed heatsink 102a by a flexible heat pipe 104. In embodiments, the first movable heatsink 102b may be physically coupled to the fixed heatsink 102a with a physical mechanism 116. In embodiments, the physical mechanism 116 may include a hinged mechanism 116a, or may include some other suitable mobile coupling mechanism such as an articulated mechanism.

In embodiments, the heatsink 102 may include a second movable heatsink 102c, which may be shown in a second position that is away from the DIMMs 112b. In embodiments, the DIMMs 112b may be disposed between the second movable heatsink 102c and the PCB 114 when the second movable heatsink 102c is in the first position (not shown) proximate to the one or more DIMMs 112b. The second movable heatsink 102c may be thermally and/or physically coupled to the fixed heatsink 102a by a flexible heat pipe 106. In embodiments, the second movable heatsink 102c may be physically coupled to the fixed heatsink 102a with a physical mechanism 118. In embodiments, the physical mechanism 118 may include a hinged mechanism 118a, or may include some other suitable mobile coupling mechanism.

In embodiments, the fixed heatsink 102a may be thermally coupled to any number of flexible heatsinks 102b, 102c using flexible heat pipes 104, 106. In embodiments, the flexible heat pipes 104, 106 may include a first rigid portion 104a, 106a, a flexible portion 104b, 106b coupled with respective first rigid portion, and a second rigid portion 104c, 106c coupled with respective flexible portion. In embodiments, the first rigid portion 104a, 106a of the flexible heat pipe 104, 106 may be thermally and/or physically coupled to the movable heatsink 102b, 102c by coming into physical contact with one or more fins 102b1, 102c1 of the movable heatsink 102b, 102c. In embodiments, this physical contact may include soldering, crimping, welding, or otherwise thermally coupling the first rigid portion 104a, 106a of the flexible heat pipe 104, 106 with the one or more fins 102b1, 102c1. In embodiments, the first rigid portion 104a, 106a of the flexible heat pipe 104, 106 may come into physical contact with one or more thermal plates, heat spreaders, and the like (not shown) that may be thermally coupled to the one or more fins 102b1, 102c1. In embodiments, the first rigid portion 104a, 106a of the flexible heat pipe 104, 106 may be bent or may be otherwise formed, for example in an S formation or a coiled formation, to thermally contact one or more physical portions of the flexible heatsink 102b, 102c. In embodiments, these various formations may also cause the flexible portion 104b, 106b of the flexible heat pipe 104, 106 to be disposed in a position to facilitate movement between the movable heatsink 102b, 102c and the fixed heatsink 102a.

In embodiments, the flexible portion 104b, 106b of the flexible heat pipe 104b may be positioned between the movable heatsink 102b, 102c and the fixed heatsink 102a to provide flexibility when the movable heatsink 102b, 102c is moved relative to the fixed heatsink 102a. In embodiments, the flexible portion 104b, 106b of the flexible heat pipe 104, 106 may provide sufficient support to hold the movable heatsink 102b, 102c in place when it is moved out of the way to allow access to the DIMMs 112a, 112b. Such access may allow, for example, a user to install or uninstall the DIMMs 112a, 112b that otherwise may not be easily accessible unless one of the movable heatsinks 102c is moved out of the way to allow access to the DIMMs 112b.

In embodiments, the fixed heatsink 102a may be thermally coupled to a heat source 108, such as a processor coupled with the PCB 114. The second rigid portion 104c, 106c of the flexible heat pipe 104, 106 may come into physical contact with one or more thermal plates, heat spreaders, and the like (not shown) that may be thermally coupled to the one or more fins 102a1 of the fixed heatsink 102a. In embodiments, the second rigid portion 104c, 106c of the flexible heat pipe 104, 106 may be bent or may be otherwise formed, for example in a S formation or a coiled formation, to thermally contact one or more physical portions of the fixed heatsink 102a. In embodiments, these various formations may also cause the flexible portion 104b, 106b of the flexible heat pipe 104, 106 to be disposed in a position to facilitate movement between the movable heatsink 102b, 102c and the fixed heatsink 102a.

In embodiments, a movable heatsink 102c may be moved away from the DIMMs 112b by a user by lifting up on the movable heatsink 102c. In embodiments, there may be a latch (not shown) that the user may have to release in order to move the movable heatsink 102c. In embodiments, a movable heatsink 102b may be returned to its position proximate to the DIMMs 112a by a user pushing down on the movable heatsink 102b. In embodiments, there may be a latch (not shown) that the user may need to secure the movable heatsink 102b into a position proximate to the DIMMs 112a.

In embodiments, the flexible heat pipe 104, 106 may be implemented as a flexible vapor chamber.

Figure 2:
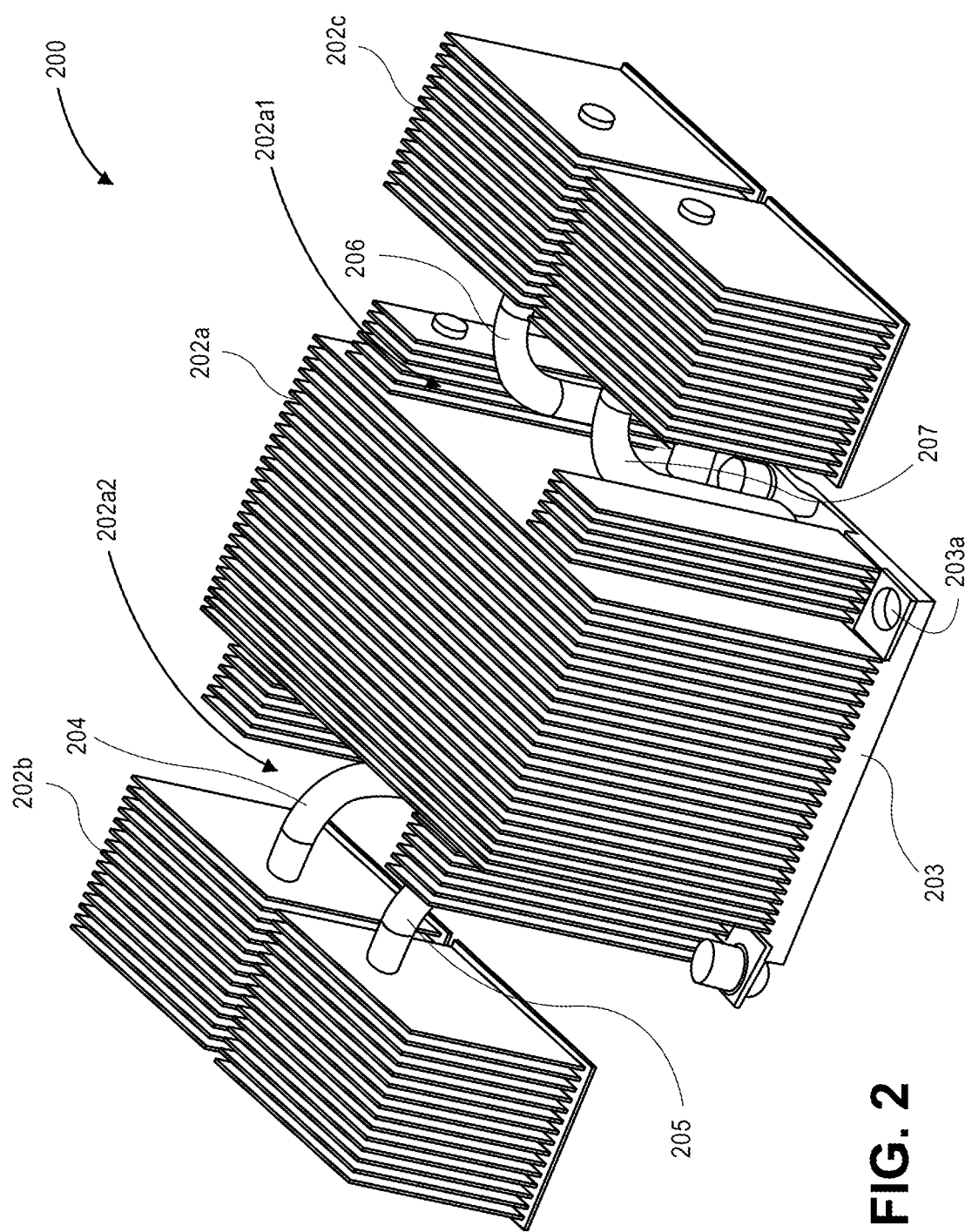
FIG. 2 is a perspective view of an example of movable heatsinks coupled to a fixed heatsink, in accordance with various embodiments.

FIG. 2 is a perspective view of an example of movable heatsinks coupled to a fixed heatsink, in accordance with various embodiments. Diagram 200 may be an example of a movable heatsink, which may be similar to heatsink 102 of FIG. 1. The heatsink 200 may include a fixed heatsink 202a, which may be similar to fixed heatsink 102a of FIG. 1. In embodiments, the fixed heatsink 202a may include a heat plate 203 and one or more anchor points 203a to which the heatsink 202a may be secured. In embodiments, the fixed heatsink 202a may be secured to a heat source, such as heat source 108 of FIG. 1, which may include a processor.

In embodiments, movable heatsinks 202b, 202c, which may be similar to movable heatsinks 102b, 102c of FIG. 1, may be thermally and/or physically coupled to the fixed heatsink 202*a* using flexible heat pipes 204, 205, 206, 207, which may be similar to flexible heat pipes 104, 106 of FIG. 1. In embodiments, there may be one or more movable heatsinks 202*b*, 202*c* attached to the fixed heatsink 202*a*. In embodiments, there may be one or more flexible heat pipes 204, 205, 206, 207, that connect a movable heatsink 202*b* to a fixed heatsink 202*a*, and may provide both a thermal coupling and a physical coupling to support the movable heatsink 202*b* in various positions (not shown) as the movable heatsink 202*b* is being moved or returned to a position as shown.

In embodiments, the movement of the movable heatsinks 202*b*, 202*c* may cause the flexible heat pipes 204, 205, 206, 207 to bend in one or more directions, to twist, to coil, or to move in some other fashion to allow the movable heatsink 202*b* to remain thermally coupled with the fixed heatsink 202*a*. In embodiments, the fixed heatsink 202*a* may include recesses 202*a*1, 202*a*2 or other features that may accommodate the flexible heat pipes 204, 205, 206, 207 when the movable heatsinks 202*b*, 202*c* may be moved, for example, above the fixed heatsink 202*a*.

Figure 3:
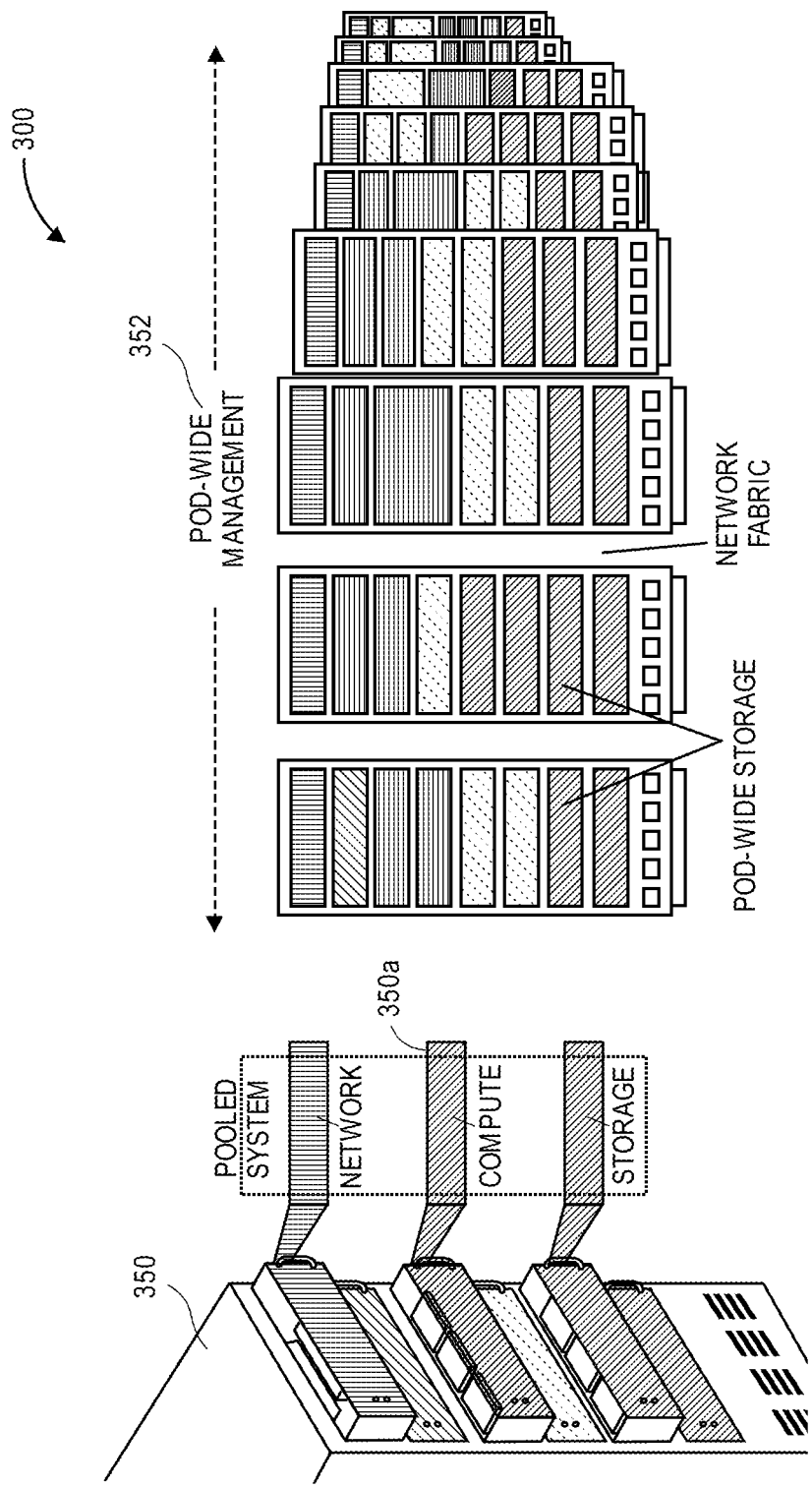
FIG. 3 is an example rack systems architecture framework into which movable heatsinks coupled to a fixed heatsink may be installed, in accordance with various embodiments.

FIG. 3 is an example rack systems architecture framework into which movable heatsinks coupled to a fixed heatsink may be installed, in accordance with various embodiments.

Diagram 300 includes a high-level schematic of Intel® Rack Scale Design™. In embodiments, one or more racks 350 may be joined into a Pod 352, which may be efficiently managed using additional hardware and software (not shown), which may use open standards such as the RESTful API standard or open-sourced RSD reference software. In embodiments, a drawer 350*a*, which may be a rack 350 location, may include one of a plurality of computing apparatuses, e.g., a computer resource, a network resource, or a storage resource. One or more of the computing apparatuses/resources may include electronic components, such as a circuit board, with movable heatsinks 102 and/or 200 that include the movable heatsinks as described above with respect to FIGS. 1-2 and 3 while the overall racks 350 may be generally air cooled or may be coolant cooled.

Figure 4:
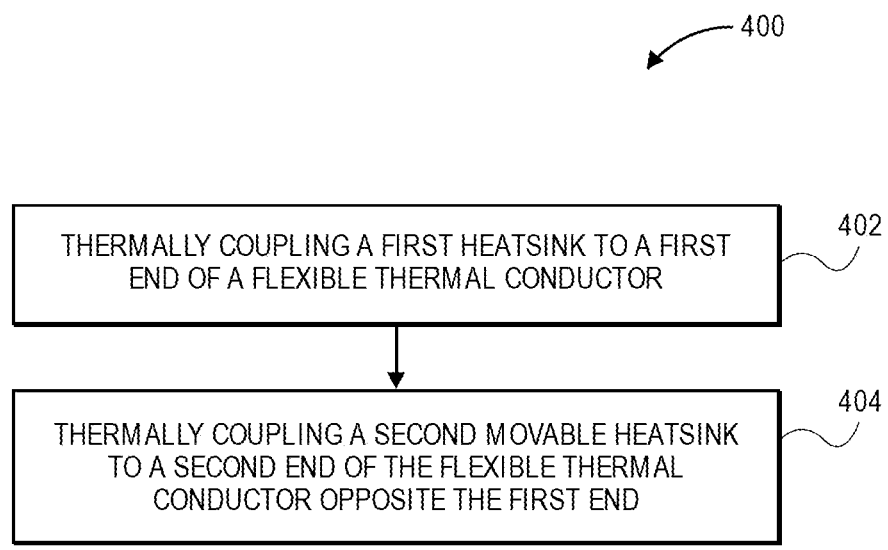
FIG. 4 is a block diagram of a process for manufacturing movable heatsinks coupled to a fixed heatsink, in accordance with various embodiments.

FIG. 4 is a block diagram of a process for assembling movable heatsinks coupled to a fixed heatsink, in accordance with various embodiments. In embodiments, the process 400 may be implemented using the techniques and components described in FIGS. 1-2.

At block 402, the process may include thermally coupling a first heatsink to a first end of a flexible thermal conductor. In embodiments, the first heatsink may be similar to fixed heatsink 102*a* of FIG. 1, or fixed heatsink 202*a* of FIG. 2. The first end of the flexible thermal conductor may be similar to flexible thermal conductor end 104*c* of flexible thermal conductor 104 of FIG. 1, and may be coupled in various ways as described with respect to FIG. 1.

At block 404, the process may include thermally coupling a second movable heatsink to a second end of the flexible thermal conductor opposite the first end. In embodiments, the second movable heatsink may be similar to the movable heatsink 102*b* of FIG. 1. The second end of the flexible thermal conductor opposite the first end may be similar to flexible thermal conductor end 104*a* of flexible thermal conductor 104 of FIG. 1.

The process may further include, wherein the flexible thermal conductor is to flex and remain thermally coupled with the first heatsink and the second heatsink, when the second heatsink is moved relative to the first heatsink. In embodiments, the second heatsink may be similar to either movable heatsink 102*b* of FIG. 1 that is in a normal position, or the second heatsink may be similar to movable heatsink 102*c* that is moved out of the way to allow access to DIMMs 112*b*. In embodiments, the first heatsink may be the fixed heatsink 202*a* of FIG. 2, and the second heatsink may be movable heatsink 202*b*, that may be both thermally coupled and supported by flexible thermal conductors 204, 205.

Various operations are described as multiple discrete operations in turn, in a manner that is most helpful in understanding the claimed subject matter. However, the order of description should not be construed as to imply that these operations are necessarily order dependent.

Example 1 may be an apparatus, comprising: a first heatsink; a second heatsink movably coupled with the first heatsink; and a flexible thermal conductor to physically and thermally couple the first heatsink to the second heatsink and to provide a motion of the second heatsink relative to the first heatsink, wherein the flexible thermal conductor is to flex and remain thermally coupled with the first heatsink and the second heatsink, when the second heatsink is moved relative to the first heatsink.

Example 2 may include the apparatus of example 1, wherein the first heatsink is to physically and thermally couple to a heat source.

Example 3 may include the apparatus of example 2, wherein the heat source is to couple to a printed circuit board (PCB).

Example 4 may include the apparatus of example 2, wherein the second movable heatsink is movable relative to the first heatsink to provide access to one or more components proximate to the heat source.

Example 5 may include the apparatus of example 4, wherein one of the one or more components is a dual in-line memory module (DIMM).

Example 6 may include the apparatus of example 1, wherein the thermal conductor is a flexible heat pipe or a flexible vapor chamber.

Example 7 may include the apparatus of example 6, wherein the first heatsink is dimensioned receive a portion of the flexible thermal conductor when the second heatsink is moved to a location proximate to the first heatsink.

Example 8 may include the apparatus of example 1, wherein the first heatsink or the second heatsink includes a plurality of fins and wherein the plurality of fins are thermally connected by one or more fixed heat pipes to route thermal energy throughout the plurality of fins.

Example 9 may include the apparatus of example 8, wherein the flexible thermal conductor is thermally coupled to the one or more fixed heat pipes.

Example 10 may include the apparatus of example 1, wherein the flexible thermal conductor is a first flexible thermal conductor, and the apparatus further comprises at least a second flexible thermal conductor thermally coupled with the first heatsink and the second heatsinks.

Example 11 they include the apparatus of example 1, further comprising an articulated physical connector between the first heatsink and the second heatsink to limit the range of movement of the second heatsink relative to the first heatsink.

Example 12 may include the apparatus of example 11, wherein the articulated physical connector is a hinge.

Example 13 may include the apparatus of example 1, wherein the apparatus further includes the heat source.

Example 14 may include the apparatus of example 1, wherein the apparatus further includes the PCB.

Example 15 may be a method comprising: thermally coupling a first heatsink to a first end of a flexible thermal conductor; thermally coupling a second movable heatsink to a second end of the flexible thermal conductor opposite the first end; and wherein the flexible thermal conductor is to flex and remain thermally coupled with the first heatsink and the second heatsink, when the second heatsink is moved relative to the first heatsink.

Example 16 may include the method of example 15, further comprising thermally coupling the first heatsink to a heat source.

Example 17 may include the method of example 15, further comprising thermally coupling the heat source to a PCB.

Example 18 may be a system, comprising: a first heatsink; a second movable heatsink; a flexible thermal conductor physically and thermally coupled with the first and second heatsinks, wherein the flexible thermal conductor is to flex and remain thermally coupled with the first heatsink and the second heatsink, when the second heatsink is moved relative to the first heatsink; a heat source thermally coupled to the first heatsink; and a PCB coupled to the heat source.

Example 19 may include the system of claim 18, further comprising: memory coupled to the PCB proximate to the heat source and disposed at least partially between the PCB and the second movable heatsink.

Example 20 may include the system of claim 19, wherein the second movable heatsink is to move relative to the first heatsink to provide access to the memory coupled to the PCB proximate to the heat source.

The foregoing description of one or more implementations provides illustration and description, but is not intended to be exhaustive or to limit the scope of the embodiments to the precise form disclosed or claimed herein. Modifications and variations are possible in light of the above teachings or may be acquired from practice of various implementations of the various embodiments. Future improvements, enhancements, or changes to particular components, methods, or means described in the various embodiments are contemplated to be within the scope of the claims and embodiments described herein, as would readily be understood by a person having ordinary skill in the art.

What is claimed is:

1. An apparatus, comprising:
   a first heatsink coupled with a substrate;
   a second heatsink movably coupled with the first heatsink, wherein a position of the second heatsink is lateral to the first heatsink with respect to the substrate and wherein one or more components coupled with the substrate is positioned between the substrate and the second heatsink; and
   a flexible thermal conductor to physically and thermally couple the first heatsink to the second heatsink and to provide a motion of the second heatsink relative to the first heatsink,
   wherein the flexible thermal conductor is to flex and remain thermally coupled with the first heatsink and the second heatsink, when the second heatsink is moved relative to the first heatsink to provide access to the one or more components and wherein the second heatsink is at least in-part parallel to one side of the substrate when access to at least one of the one or more components is at least partially blocked.

2. The apparatus of claim 1, wherein the first heatsink is to physically and thermally couple to a heat source.

3. The apparatus of claim 2, wherein the substrate is a printed circuit board (PCB).

4. The apparatus of claim 1, wherein one of the one or more components is a dual in-line memory module (DIMM).

5. The apparatus of claim 1, wherein the thermal conductor is a flexible heat pipe or a flexible vapor chamber.

6. The apparatus of claim 5, wherein the first heatsink is dimensioned to receive a portion of the flexible thermal conductor when the second heatsink is moved to a location proximate to the first heatsink.

7. The apparatus of claim 1, wherein the first heatsink or the second heatsink includes a plurality of fins and wherein the plurality of fins are thermally connected by one or more fixed heat pipes to route thermal energy throughout the plurality of fins.

8. The apparatus of claim 7, wherein the flexible thermal conductor is thermally coupled to the one or more fixed heat pipes.

9. The apparatus of claim 1, wherein the flexible thermal conductor is a first flexible thermal conductor, and the apparatus further comprises at least a second flexible thermal conductor thermally coupled with the first heatsink and the second heatsink.

10. The apparatus of claim 1, further comprising an articulated physical connector between the first heatsink and the second heatsink to limit the range of movement of the second heatsink relative to the first heatsink.

11. The apparatus of claim 10, wherein the articulated physical connector is a hinge.

12. The apparatus of claim 1, wherein the apparatus further includes a heat source positioned between and thermally coupled to the first heatsink and the substrate.

13. The apparatus of claim 12, wherein the substrate is a PCB.

14. A method comprising:
    coupling a substrate to a first heatsink;
    thermally coupling a first heatsink to a first end of a flexible thermal conductor;
    thermally coupling a second movable heatsink to a second end of the flexible thermal conductor opposite the first end, wherein a position of the second heatsink is lateral to the first heatsink with respect to the substrate and wherein one or more components coupled with the substrate is positioned between the substrate and the second heatsink; and
    wherein the flexible thermal conductor is to flex and remain thermally coupled with the first heatsink and the second heatsink, when the second heatsink is moved relative to the first heatsink to provide access to the one or more components and wherein the second heatsink is at least in-part parallel to one side of the substrate when access to at least one of the one or more components is at least partially blocked.

15. The method of claim 14, further comprising thermally coupling the first heatsink to a heat source.

16. The method of claim 14, wherein the substrate is a printed circuit board (PCB).

17. A system, comprising:
    a first heatsink coupled with a PCB;
    a second movable heatsink, wherein a position of the second heatsink is lateral to the first heatsink with respect to the PCB and wherein one or more components coupled with the PCB is positioned between the PCB and the second heatsink;
    a flexible thermal conductor physically and thermally coupled with the first and second heatsinks,
    wherein the flexible thermal conductor is to flex and remain thermally coupled with the first heatsink and the second heatsink, when the second heatsink is moved relative to the first heatsink and wherein the second heatsink is at least in-part parallel to one side of the PCB when access to at least one of the one or more components is at least partially blocked;

a heat source thermally coupled to the first heatsink, wherein the PCB is coupled to the heat source.

18. The system of claim 17, wherein the one or more components includes memory coupled to the PCB proximate to the heat source and disposed at least partially between the PCB and the second movable heatsink.

19. The system of claim 18, wherein the second movable heatsink is to move relative to the first heatsink to provide access to the memory coupled to the PCB proximate to the heat source.

* * * * *